(12) United States Patent
Boufnichel

(10) Patent No.: US 11,373,994 B2
(45) Date of Patent: Jun. 28, 2022

(54) ISOLATION TRENCHES FOR ESD CIRCUITS

(71) Applicant: STMicroelectronics (Tours) SAS, Tours (FR)

(72) Inventor: Mohamed Boufnichel, Monnaie (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 17/028,732

(22) Filed: Sep. 22, 2020

(65) Prior Publication Data

US 2021/0098444 A1    Apr. 1, 2021

(30) Foreign Application Priority Data

Sep. 30, 2019  (FR) ...................................... 1910806

(51) Int. Cl.
*H01L 27/02*    (2006.01)
*H01L 21/762*   (2006.01)
*H01L 29/06*    (2006.01)

(52) U.S. Cl.
CPC .... *H01L 27/0248* (2013.01); *H01L 21/76224* (2013.01); *H01L 27/0251* (2013.01); *H01L 27/0255* (2013.01); *H01L 29/0649* (2013.01)

(58) Field of Classification Search
CPC .......... H01L 27/0248; H01L 21/76224; H01L 29/0649; H01L 27/0255; H01L 27/0251; H01L 21/76283
USPC ............................. 257/499, 501; 438/218, 2
See application file for complete search history.

(56) References Cited

U.S. PATENT DOCUMENTS

| | | | |
|---|---|---|---|
| 6,406,975 B1 * | 6/2002 | Lim et al. | H01L 21/764 438/421 |
| 2003/0234423 A1 | 12/2003 | Bui et al. | |
| 2007/0194403 A1 * | 8/2007 | Cannon et al. | H01L 27/0921 257/506 |
| 2010/0230741 A1 * | 9/2010 | Choi et al. | H01L 29/764 257/324 |
| 2012/0091504 A1 * | 4/2012 | Davis et al. | H01L 29/861 257/146 |
| 2014/0028192 A1 | 1/2014 | Dehe et al. | |
| 2016/0172250 A1 | 6/2016 | Shue et al. | |

* cited by examiner

*Primary Examiner* — Thinh T Nguyen
(74) *Attorney, Agent, or Firm* — Seed IP Law Group LLP

(57) ABSTRACT

Methods and devices for protecting against electrical discharges are provided. One such device for protecting against electrical discharges includes a semiconductor substrate and an isolation trench in the semiconductor substrate. The isolation trench includes an enclosed space that contains a gas.

21 Claims, 3 Drawing Sheets

ISOLATION TRENCHES FOR ESD CIRCUITS

BACKGROUND

Technical Field

The present disclosure relates generally to electronic devices and, more specifically, to electronic devices for protecting against electrostatic discharges.

Description of the Related Art

Various devices for preventing and protecting against electrostatic discharges are known.

BRIEF SUMMARY

There is a need to improve the performance of the current devices for protecting against electrostatic discharges.

An embodiment provides an isolation trench in a semiconductor substrate, comprising an enclosed space that contains a gas.

According to an embodiment, 60% of the volume of the enclosed space is occupied by the gas.

An embodiment provides a method for manufacturing an isolation trench in a semiconductor substrate, comprising a step of enclosing a gas in an enclosed space.

According to an embodiment, the method comprises a step of opening the substrate by deep reactive ion etching in order to form the trench.

According to an embodiment, the trench is closed by a deposition, non-conformal, of a first oxide at the surface of the same.

According to an embodiment, the first oxide is silicon dioxide.

According to an embodiment, the non-conformal deposition is performed by plasma enhanced chemical vapor deposition.

According to an embodiment, the non-conformal deposition is performed by physical vapor deposition.

According to an embodiment, the first oxide has a thickness comprised between 0.1 and 3 µm. In some embodiments, the first oxide has a thickness between 0.5 and 1.5 µm, and in some embodiments, the thickness is equal to approximately 1 µm, for example equal to 1 µm.

According to an embodiment, the walls of the trench are thermally oxidized by a second oxide.

According to an embodiment, the second oxide is silicon dioxide.

According to an embodiment, the second oxide has a thickness comprised between 100 and 900 nm. In some embodiments, the second oxide has a thickness between 200 and 250 nm, and in some embodiments, the thickness of the second oxide is equal to approximately 215 nm, for example equal to 215 nm.

According to an embodiment, the trench, before oxidation, has a width comprised between 0.5 and 4 µm, in some embodiments between 1 and 2 µm, and in some embodiments the width is equal to approximately 1.6 µm, for example equal to 1.6 µm.

According to an embodiment, the trench, before oxidation, has a depth comprised between 10 and 25 µm, in some embodiments between 15 and 20 µm, and in some embodiments the depth is equal to approximately 17 µm, for example equal to 17 µm.

According to an embodiment, the gas is chosen from dry air, dinitrogen, argon or a residual gas used for the trench formation, for example tetraethyl orthosilicate.

An embodiment provides a device for protecting against electrical discharges comprising at least one trench.

According to an embodiment, the device has a clamping voltage lower than or equal to 30 V.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
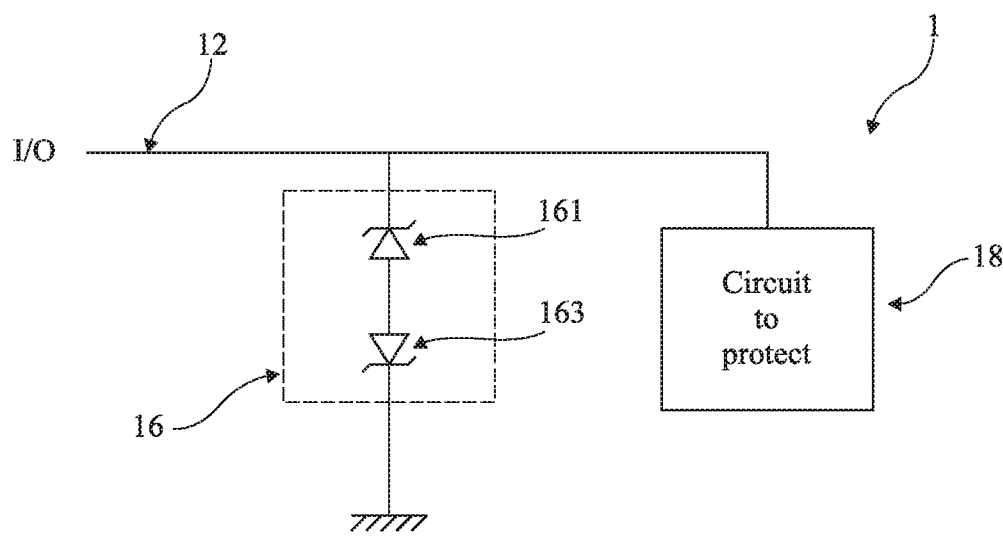
FIG. 1 illustrates, in a very schematic fashion, an example electronic circuit for protecting against electrostatic discharges of the type to which the described embodiments apply.

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, an application to protection circuits against electrostatic discharges is taken as an example, but the described embodiments of isolation trenches apply more generally to any integrated circuit using isolation trenches.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and in some embodiments within 5%.

The embodiments described in the following apply to integrated circuits, in particular in order to protect them from electrostatic discharges.

Electrostatic Discharges (ESD) occur between two elements having different electric potentials. This is translated by the passage of an electric current, between these two elements, in order to balance the potentials. Electrostatic discharges, which are frequent inter alia during the manufacture of integrated circuits, can cause on the circuits and/or the components a partial or total malfunction of the same.

Current integrated circuits generally integrate internal devices for protecting against electrostatic discharges. The protective devices against electrostatic discharges generally resemble, in their operation, components such as MOS transistors, thyristors, and more specifically diodes.

These devices evacuate (shunt) the current when it is too large and exceeds a certain threshold. By said shunting, it is possible to protect the circuit as it avoids currents that are too high from passing through it, and thus damaging it.

In an integrated circuit, the ESD structures can be isolated from the rest of the circuit by Shallow Trench Isolation (STI) or Deep Trench Isolation (DTI). Such trenches are, more generally, present in an integrated circuit for separating (isolating) components realized in a substrate.

The isolation trenches are usually covered with a layer of silicon oxide providing the isolation, then filled with polycrystalline silicon (poly-Si).

According to the described embodiments of realization and implementation, the replacement of the polycrystalline silicon with a gas is provided, for example, by air or a gas present in the controlled atmosphere of the substrate processing chamber. The relatively low permittivity (close to 1) of the gases compared to that of the polycrystalline silicon (in the order of 11-12) is thus exploited. By this means, assuming an equal trench width, it is possible to reduce the electrical capacitance of the trench, which improves the effectiveness of the ESD protection.

As a variant, the trenches are not covered with oxide and are completely constituted by a gas.

The presence of air could have been feared to be detrimental to the operation of the circuit. Indeed, steps are usually taken to avoid the presence of air or of gas in the substrates in order to avoid weakening their structures. However, it is observed that filling the entire trench with dry air is not disruptive.

FIG. 1 illustrates, in a very schematic fashion, an example electronic circuit for protecting against electrostatic discharges of the type to which the described embodiments apply.

In the example of the electronic circuit shown in FIG. 1, an ESD protective circuit 16 for protecting a sole input/output (I/O) pad 12 of an integrated circuit is considered. However, an integrated circuit generally possesses a plurality of input/output pads 12. Each input/output pad 12 is thus generally protected by an ESD protective circuit 16.

The device 1 illustrated in FIG. 1 comprises, inter alia, the input/output (I/O) pad 12 of the circuit to protect 18, coupled to the ground by the ESD protective circuit 16. In practice, a second identical circuit 16 couples the pad 12 to a, for example positive, supply rail.

The ESD circuit 16, or ESD protective circuit, comprises two Zener diodes 161 and 163 mounted in anti-series between the pad 12 and, in the illustrated example, the ground. The two diodes 161 and 163 are interconnected by their anodes. The diode 161 is coupled, e.g., connected, by its cathode to the input/output pad 12 and to the circuit to protect 18. The diode 163 is coupled, e.g., connected, by its cathode to the ground.

The operation of an ESD protective circuit is generally known. It will be briefly recalled below.

Figure 2:
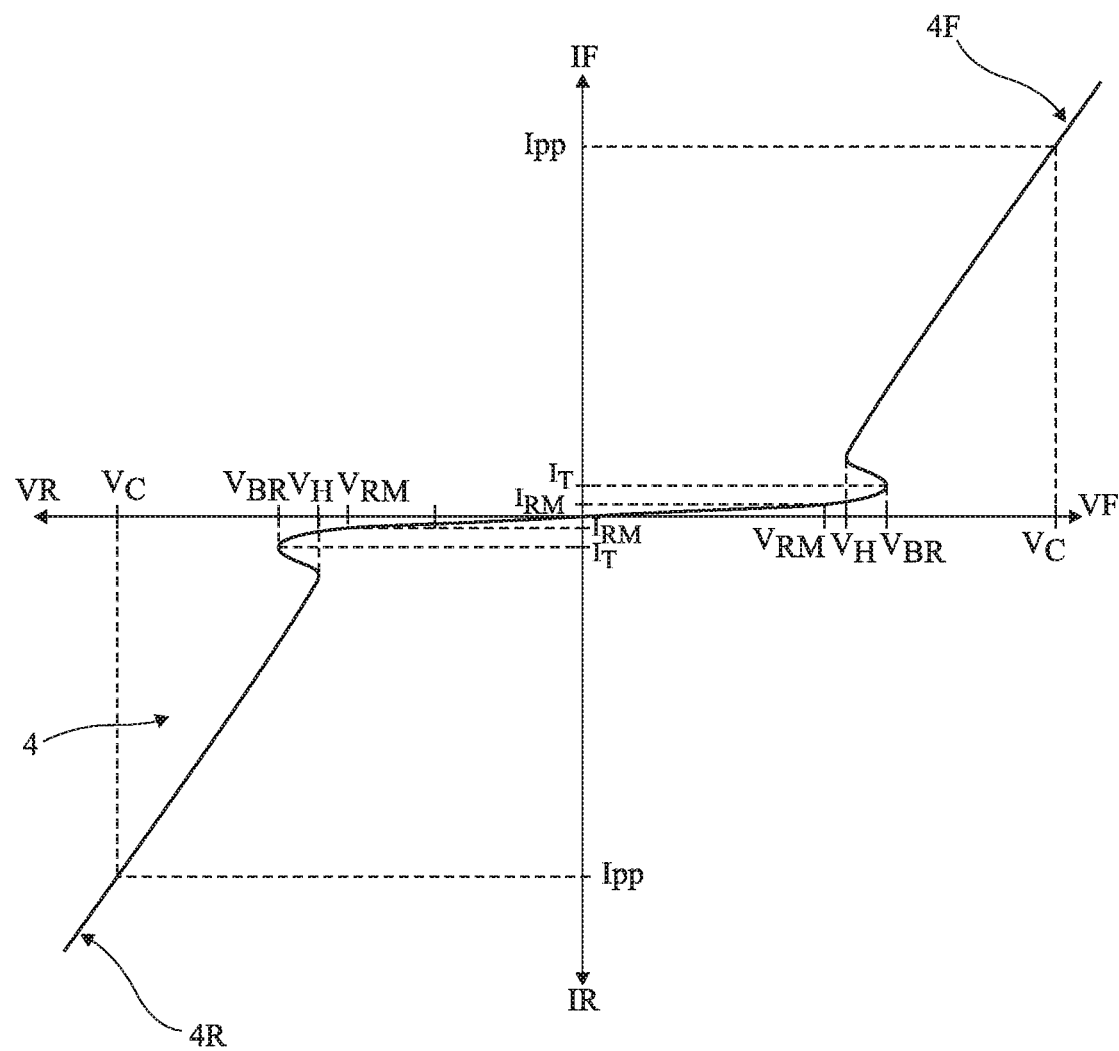
FIG. 2 illustrates an example current-voltage characteristic of a device for protecting against electrostatic discharges.

FIG. 2 illustrates an example current-voltage characteristic of a device for protecting against electrostatic discharges.

The current-voltage characteristic 4 shown in FIG. 2 corresponds, for example, to that of the equivalent circuit shown in relation to FIG. 1.

The curve 4 illustrates a variation in intensity of the electric forward current IF, or reverse current IR, flowing in the ESD circuit 16. This intensity is a function of the forward voltage VF of the ESD circuit 16, or of the reverse voltage VR.

The curve 4, in FIG. 2, is divided into two portions:
a portion 4R (on the left, in FIG. 2) corresponding to variations in the reverse current IR as a function of the reverse voltage VR; and
a portion 4F (on the right, in FIG. 2) corresponding to variations in the forward current IF as a function of the forward voltage VF.

The portions 4R and 4F are, apart from their sign, substantially identical. Thus, only the portion 4R will be described in detail in the following.

During normal operation, the forward voltage VF of the ESD circuit 16 can have values comprised between 0 V and a maximum working voltage $V_{RM}$. This maximum working voltage $V_{RM}$ corresponds to the maximum voltage for a given application. The maximum working voltage $V_{RM}$ is, for example, in the order of 16 V. When the circuit 16 is biased with a voltage lower than this maximum working voltage $V_{RM}$, a so-called leakage current $I_{RM}$, passes through the circuit 16.

In case of an overvoltage due, for example, to an electrostatic discharge, a bias voltage VF exceeds a breakdown voltage $V_{BR}$. The voltage $V_{BR}$ is usually defined by a given test current value $I_T$. This test current $I_T$ is generally comprised between 1 mA and 20 mA.

In order to avoid an untimely breakdown of the ESD protection 16, the breakdown voltage $V_{BR}$ is chosen to be greater than the maximum working voltage $V_{RM}$. For example, the breakdown voltage $V_{BR}$ is greater by 10 to 15% than the maximum working voltage $V_{RM}$.

When the breakdown voltage $V_{BR}$ is exceeded, i.e., once the protection triggered, the circuit 16 has at its terminals a voltage lower than the breakdown voltage $V_{BR}$. This phenomenon is called snap back. The bias voltage can thus decrease until a minimum voltage value or holding voltage $V_H$.

The protective maximum voltage is defined by a so-called clamping voltage $V_C$ which corresponds to a peak pulse current $I_{pp}$ acceptable by the protection 16.

Figure 3:
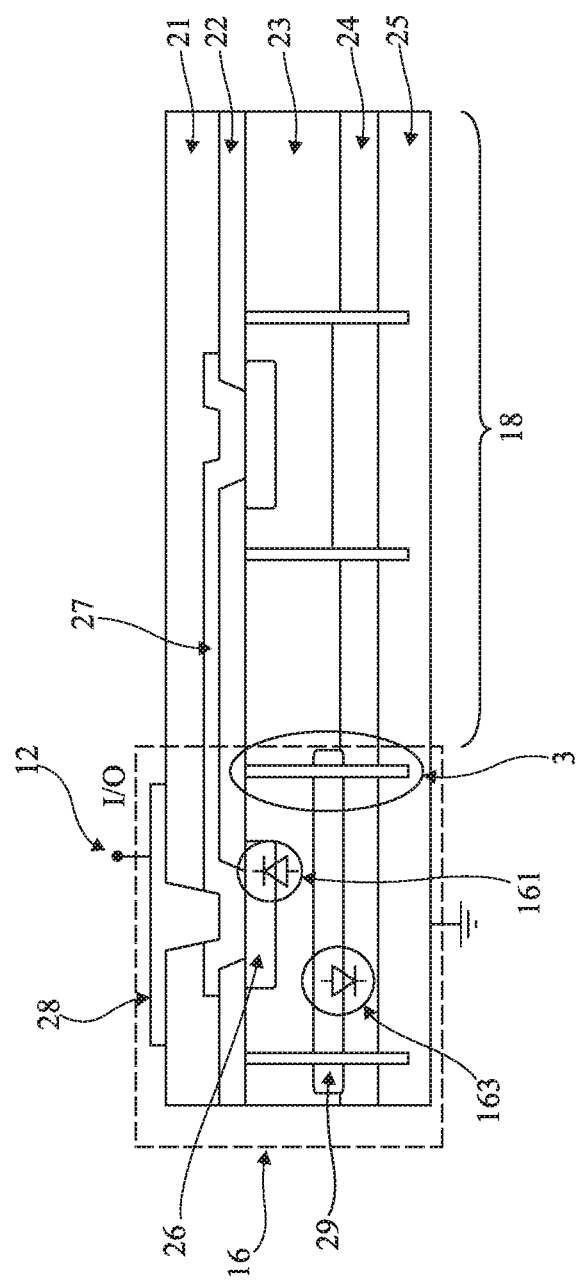
FIG. 3 is a partial and schematic sectional view of a protective circuit for protecting against electrostatic discharges realized in an integrated form.

FIG. 3 is a partial and schematic sectional view of a protective circuit for protecting against electrostatic discharges realized in an integrated form.

FIG. 3 illustrates an embodiment of an integrated circuit provided with an ESD protective function. The device illustrated in FIG. 3 comprises an input/output (I/O) pad 12. The integrated circuit comprises an ESD protective circuit 16 (dotted line in FIG. 3) and a protected circuit 18, coupled to the pad 12.

Only the part of the integrated circuit corresponding to the ESD protective circuit 16 will be described in detail in the following.

The ESD circuit 16 is realized in a semiconductor substrate 25 of the integrated circuit. The substrate 25 is constituted by a material of a first type of conductivity, for example n-type doped single-crystal silicon.

The device 16 is constituted by the following layers, starting from the substrate 25:
a first epitaxied layer 24, of the first n-type of conductivity;

a buried second layer 29, of a second p-type of conductivity, heavily doped, which extends essentially over the entire surface of the protective circuit 16;

a third layer 23, of the second p-type of conductivity and lightly doped; and a fourth layer or zone 26 formed in the layer 23, of the first n-type of conductivity and heavily doped.

The stack of the layers 24, 29, 23 and 26 is electrically isolated from the rest of the integrated circuit by trenches 3. The trenches 3 extend from the front (upper) face of the layer 23 to the substrate 25. The zone 26 constitutes a contact area and does not extend up to the trenches 3.

The substrate 25 is coupled, e.g., connected, to the ground by its rear face.

The entirety is covered by a fifth isolating layer 22. This layer 22 is open at the contact area 26.

A connecting track 27, etched in a level of metallization, couples the contact area 26 and contact area of the circuit 18, intended to be coupled to the pad 12.

A sixth passivation layer 21 covers the entire structure (the isolating layer 22 and the connecting track 27).

The passivation layer 21 is open in order to allow a connection of the track 27 to a conductive pad 28 (UBM, Under Bump Metallization). The pad 28 is intended to receive an outer connecting bracket or solder bump.

The second layer 29 and the third layer 23 respectively form, with the first layer 24 and the zone 26, p-n junctions. In this example:

the second layer 29 and the first layer 24 form the diode 163, the second layer 29 of which is the anode and the first layer 24 of which the cathode; and the third layer 23 and the zone 26 form the diode 161, the zone 26 of which is the cathode and the third layer 23 of which the anode.

The diode 161 is coupled to the pad 12 by the track 27. The diode 163 is coupled to the ground, by the substrate 25. The two diodes 161 and 163 are interconnected by their anodes. In some embodiments, the trench 3 laterally surrounds the diodes 161 and 163.

As a particular example of realization, the conductivity of the third layer 23 is comprised between 4 and 6 Ω·cm, in some embodiments approximately equal to 5 Ω·cm, and in some embodiments the conductivity is equal to 5 Ω·cm.

Still as a particular example of realization, the passivation layer 21 is poly(p-phenylene-2,6-benzobisoxazole) (PBO). The passivation layer 21 has, for example, a thickness comprised between 3 and 10 μm, in some embodiments approximately equal to 6 μm, and in some embodiments the thickness is equal to 6 μm.

Figure 4A:
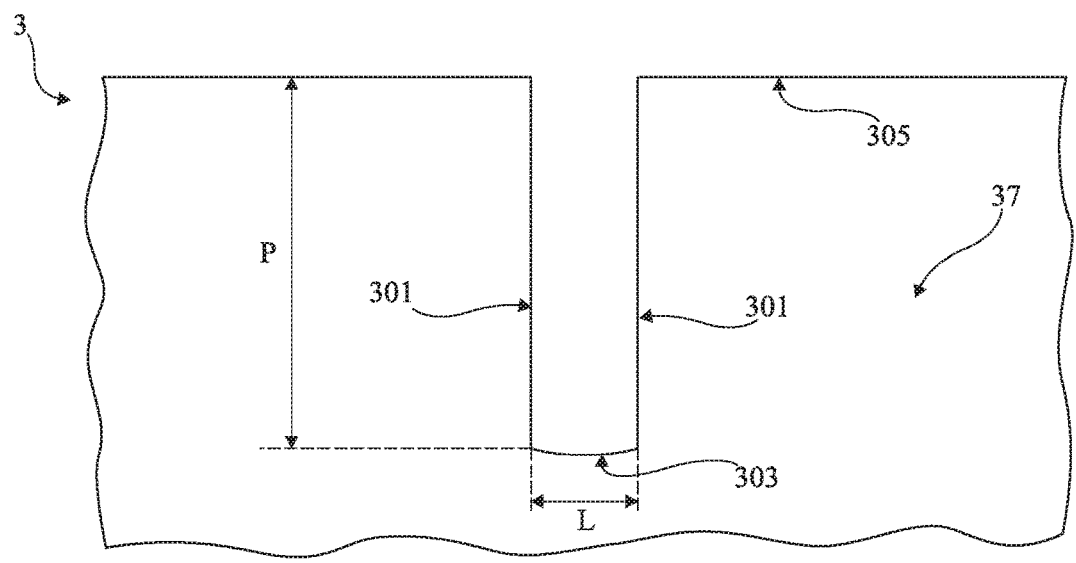
FIGS. 4A, 4B, and 4C illustrate in a partial and schematic fashion, by sectional views, steps of an embodiment of a method for manufacturing the circuit shown in FIG. 3.
Figure 4B:
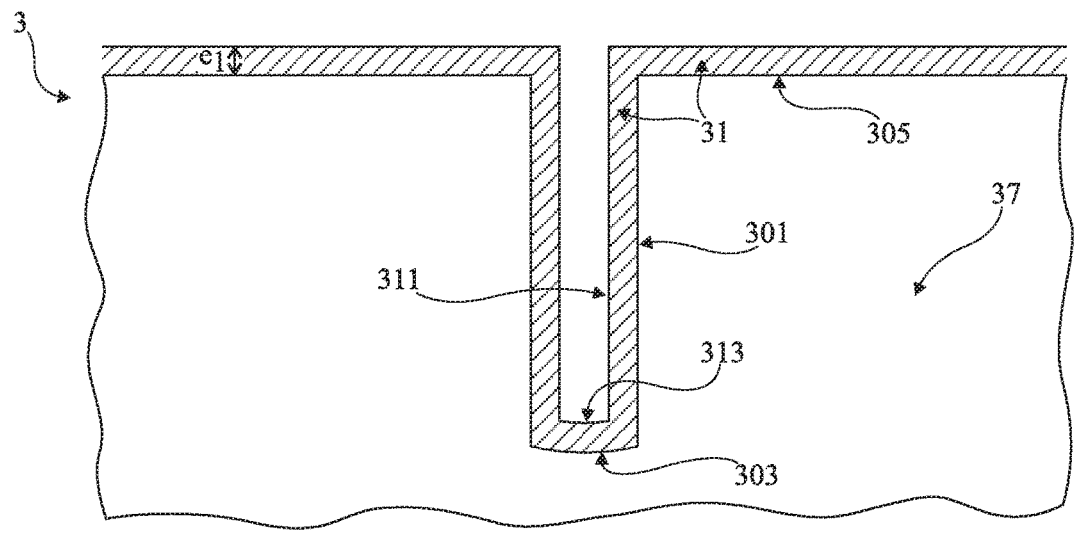
Figure 4C:
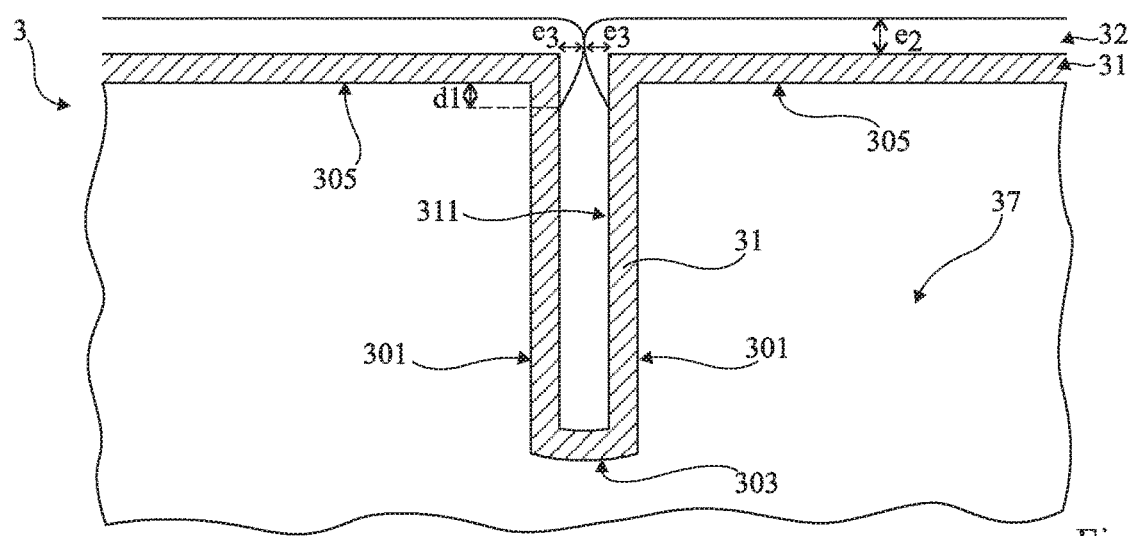

FIGS. 4A, 4B, and 4C illustrate in a partial and schematic fashion, by sectional views, steps of an embodiment of a method for manufacturing the circuit shown in FIG. 3.

These views only illustrate the formation of a trench 3. In practice, as is usual in the manufacture of integrated circuits, a large number of trenches 3 is realized at the same time on the semiconductor platelet.

One starts (FIG. 4A) by etching a trench 3 in a stack or semiconductor substrate 37 (FIG. 3).

The trench 3 is etched, for example, in the substrate 37 by a Deep Reactive Ion Etching (DRIE). It extends from an upper or front face 305 of the substrate 37 and comprises two lateral walls 301 and a bottom 303. The dimensions of the trench 3 are its depth P, and its width L.

The depth P corresponds to the distance between the upper face 305 and the bottom 303 of the trench 3. The width L corresponds to the distance between the two lateral walls 301.

The depth P is, for example, comprised between 10 and 25 μm, in some embodiments between 15 and 20 μm, in some embodiments the depth P preferably is equal to approximately 17 μm, or equal to 17 μm.

The width L is, for example, comprised between 0.5 and 4 μm, in some embodiments between 1 and 2 μm, in some embodiments the width L is equal to approximately 1.6 μm, for example equal to 1.6 μm.

Optionally, (FIG. 4B), the walls 301 and the bottom 303 of the trench 3 are subjected, with the upper face 305 of the substrate 37, to a thermal oxidation, by an oxide 31 (second oxide). The thermal oxide 31 is, for example, silicon dioxide ($SiO_2$).

The deposited oxide 31 forms a uniform layer, of a thickness e1, on the walls 301 and 303 and on the upper face 305. After oxidation, lateral walls 311 and a bottom 313 are obtained. The thickness e1 of the oxide layer 31 is, for example, comprised between 100 and 900 nm, in some embodiments between 200 and 250 nm, in some embodiments the thickness e1 is equal to approximately 215 nm, for example to 215 nm.

As illustrated in FIG. 4A, or FIG. 4B in the case of an oxidation of the trench, a layer 32 is deposited above the trench so as to form a plug. The air or the ambient gas (in the processing enclosure during this step) is thus trapped in the trench 3.

The gas is a dielectric gas and is, for example dry air, dinitrogen, argon or a residual gas used for the trench formation (for example TEOS, TetraEthyl OrthoSilicate).

The deposition of the layer 32 is non-conformal above the trench.

The deposition of the layer 32 is realized, for example, by a Plasma Enhanced Chemical Vapor Deposition (PECVD). Thus, the material 32 is ionized in another gas in order to form a plasma. The other gas is, for example, TEOS. The handling conditions (temperature of the substrate and pressure) are set in order to have a high coefficient of adhesion (of the material 32 present in the plasma). As a particular example, the conditions are set in order that the adhesion of a particle of the material 32, present in the plasma, occurs after only one or two collisions. The layer 32 thus forms a plug at the surface of the trench 3.

The layer 32 is inserted in the trench 3 over a depth or distance d1 (from the face 305), along the walls 311. The depth d1 is, for example, comprised between 100 nm and 17 μm, in some embodiments between 1 μm and 17 μm, in some embodiments the thickness is equal to approximately 4 μm, for example equal to 4 μm.

The layer 32 is inserted in the trench 3 and its thickness in the trench follows a gradient. At the highest point of the trench (at the level of the upper face of the layer 31 or the stack 37 in absence of the layer 31), the layer 32 has a horizontal thickness or width e3. The thickness e3 of the layer 32 is, for example, comprised between 100 nm and 10 μm, in some embodiments between 100 nm and 3 μm, in some embodiments the thickness e3 is equal to approximately 0.8 μm, for example equal to 0.8 μm.

On either side of the trench 3, the layer 32 has a thickness e2.

The ratio of the thicknesses e3 and e2 is, for example, approximately equal to 0.8. In other words, the thickness e3 is, for example, equal to approximately 80% of the thickness e2. The thickness e2 is, for example, comprised between 100 nm and 10 μm, in some embodiments between 100 nm and 3 μm, in some embodiments the thickness e2 is equal to approximately 1 μm, for example equal to 1 μm. In some embodiments, a volume of the enclosed space that contains the gas is about 60% of a volume of the trench 3.

The material of the layer 32 is, for example, an oxide (first oxide), which in some embodiments may be silicon dioxide ($SiO_2$).

In a further embodiment, the deposition of the layer 32 can be realized by physical vapor deposition (PVD).

The introduction of gas into the trench makes it possible to decrease the relative permittivity (Cr) of the trench. In order to decrease the capacitance of the trench 3, the width can be increased. However, structurally, it is important that the trench is narrow enough in order for the plug to form. The width L which makes it possible to reconcile these two demands is called the critical width. The critical width is approximately equal to 1.6 µm, in some embodiments, equal to 1.6 µm for a depth P of the trench 3 approximately equal to 17 µm.

An advantage of the described embodiments of realization and implementation is the decrease in the capacitance of the trench 3 in order to decrease the negative contributions, parasitic effects, on the performance of the circuit. Indeed, for a clamping voltage ($V_C$) of 30 V to 16 A, the capacitance of the trench is approximately equal to 130 fF.

A further advantage of the described embodiments of realization and implementation is the increase in the dielectric rigidity of the trench, compared to a trench filled with polycrystalline silicon.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for protecting against electrical discharges, comprising:
   a semiconductor substrate;
   a first isolation trench in the semiconductor substrate, the first isolation trench including an enclosed space that contains a gas;
   a second isolation trench in the semiconductor substrate, the second isolation trench including an enclosed space that contains a gas;
   a first diode adjacent to the first isolation trench; and
   a second diode adjacent to the second isolation trench,
   wherein the first diode and the second diode are between the first isolation trench and the second isolation trench.

2. The device according to claim 1, wherein a volume of the enclosed space that contains the gas is about 60% of a volume of the first isolation trench and the second isolation trench.

3. The device according to claim 1, comprising:
   a first oxide layer on a surface of the semiconductor substrate, and on sidewalls and a bottom surface of the first and second isolation trenches; and
   a second oxide layer on the first oxide layer, the second oxide layer enclosing the gas between the second oxide layer and portions of the first oxide layer on the sidewalls and the bottom surface of the first and second isolation trenches.

4. A method for manufacturing a device for protecting against electrical discharges, comprising:
   forming a first isolation trench in a semiconductor substrate;
   forming a second isolation trench adjacent to the first isolation trench in the semiconductor substrate;
   forming a first diode and a second diode between the first isolation trench and the second isolation trench; and
   enclosing a gas in an enclosed space in the first isolation trench.

5. The method according to claim 4, wherein forming the first isolation trench includes forming an opening in the substrate by deep reactive ion etching.

6. The method according to claim 5, wherein enclosing the gas in the enclosed space in the first isolation trench includes performing a non-conformal deposition of a first oxide at a surface of the substrate and closing the opening in the substrate.

7. The method according to claim 6, wherein the first oxide is silicon dioxide.

8. The method according to claim 6, wherein the non-conformal deposition is performed by plasma enhanced chemical vapor deposition.

9. The method according to claim 6, wherein the non-conformal deposition is performed by physical vapor deposition.

10. The method according to claim 6, wherein the first oxide has a thickness between 0.1 µm and 3 µm.

11. The method according to claim 6, further comprising forming a second oxide on walls of the first isolation trench by thermal oxidation.

12. The method according to claim 11, wherein the second oxide is silicon dioxide.

13. The method according to claim 11, wherein the second oxide has a thickness between 100 nm and 900 nm.

14. The method according to claim 6, wherein the trench has a width between 0.5 µm and 4 µm.

15. The method according to claim 6, wherein the first isolation trench has a depth between 10 µm and 25 µm.

16. The method according to claim 4, wherein the gas comprises at least one of: dry air, dinitrogen, argon or tetraethyl orthosilicate.

17. A device, comprising:
   a semiconductor substrate;
   a first circuit at least partially formed in the semiconductor substrate; and
   an electrostatic discharge (ESD) protection circuit electrically coupled to the first circuit, the ESD protection circuit, in operation, protects the first circuit against electrical discharges, the ESD protection circuit including:
      a first isolation trench and a second isolation trench extending into the semiconductor substrate and having an enclosed space that contains a gas; and
      a first diode and a second diode between the first isolation trench and the second isolation trench.

18. The device according to claim 17, wherein the ESD protection circuit has a clamping voltage lower than or equal to 30 V.

19. The device according to claim 17, wherein the ESD protection circuit includes:

a first oxide layer on a surface of the semiconductor substrate, and on sidewalls and a bottom surface of the first and second isolation trenches; and a second oxide layer on the first oxide layer, the second oxide layer enclosing the gas between the second oxide layer and portions of the first oxide layer on the sidewalls and the bottom surface of the first and second isolation trenches.

20. The device according to claim 17, wherein the first diode and the second diode each includes an anode, and wherein the anode of the first diode and the anode of the second diode are coupled to each other.

21. The device according to claim 1, wherein the first diode and the second diode each includes an anode, and wherein the anode of the first diode and the anode of the second diode are coupled to each other.

* * * * *